(12) United States Patent
Chapman

(10) Patent No.: US 6,697,507 B1
(45) Date of Patent: Feb. 24, 2004

(54) GHOST ARTIFACT REDUCTION

(75) Inventor: Barry Leonard Walter Chapman, Beeston (GB)

(73) Assignee: BTG International Limited, London (GB)

( * ) Notice: Subject to any disclaimer, the term of this patent is extended or adjusted under 35 U.S.C. 154(b) by 0 days.

(21) Appl. No.: 09/566,383

(22) Filed: May 8, 2000

Related U.S. Application Data

(63) Continuation of application No. PCT/GB98/03651, filed on Dec. 8, 1998.

(30) Foreign Application Priority Data

Dec. 10, 1997 (GB) .............................................. 9726143

(51) Int. Cl.[7] .............................. G06T 5/00; G06T 7/20; A61B 5/055; G01R 33/565
(52) U.S. Cl. ...................... 382/131; 382/254; 382/275; 382/107; 600/410; 600/425
(58) Field of Search ................................. 382/128, 131, 382/107, 275, 254, 280; 600/410, 425

(56) References Cited

U.S. PATENT DOCUMENTS

| | | | | |
|---|---|---|---|---|
| 4,663,591 A | * | 5/1987 | Pelc et al. | 324/309 |
| 4,706,026 A | * | 11/1987 | Pelc et al. | 324/309 |
| 4,751,462 A | * | 6/1988 | Glover et al. | 324/309 |
| 5,023,553 A | * | 6/1991 | Sano et al. | 324/309 |
| 5,138,259 A | | 8/1992 | Schmidt et al. | |
| 5,493,224 A | | 2/1996 | Shiono et al. | |
| 5,539,311 A | | 7/1996 | Takiguchi et al. | |
| 6,088,611 A | * | 7/2000 | Lauterbur et al. | 600/407 |
| 6,184,682 B1 | * | 2/2001 | Ehman et al. | 324/309 |

FOREIGN PATENT DOCUMENTS

| | | |
|---|---|---|
| DE | 40 05 675 | 8/1991 |
| EP | 0 644 437 | 3/1995 |
| WO | WO 95/17850 | 7/1995 |

OTHER PUBLICATIONS

Jesmanowicz, A. et al., "Phase Correction for EPI Using Internal Reference Lines", Society of Magnetic Resonance in Medicine 3, p. 1239, (1993).

Hu, X. et al., "Artifact Reduction in EPI with Phase–Encoded Reference Scan", Magnetic Resonance in Medicine 36 N° 1, 166–171, (1996).

Bruder, H. et al., "Image Reconstruction for Echo Planar Imaging with nonequidistant k–Space Sampling", Magnetic Resonance in Medicine 23, 311–323 (1992).

Chapman, B. et al., "Real–Time Movie Imaging from a Single Cardiac Cycle by NMR" 5, 246–254 (1987).

Simkin, J. et al., "Magnetostatic Field Computed using an Integral Equation Derived from Green's Theorems", Compumag Conference (1976).

Buonocore M. et al., "Ghost Artifact Reduction for Echo Planar Imaging Using Imaging Phase Correction", MRM 38, 89–100 (1997).

Mansfield, P. et al., "Biological and Medical Imaging by NMR", Journal of Magnetic Resonance 29, 355–373 (1978).

* cited by examiner

*Primary Examiner*—Scott Rogers
(74) *Attorney, Agent, or Firm*—Nixon & Vanderhye PC

(57) ABSTRACT

A method of and apparatus for reducing ghost artifact in image data are disclosed, for use with a Magnetic Resonance Imaging apparatus in which one or more coherent ghost artifacts occur in the image. The apparatus comprises means for converting the sampled data into the image data, and means for analysing the sampled data to determined a correction to reduce the ghost artifact. The method of the invention comprises analysing the sampled data to determine a correction to reduce the ghost artifact.

63 Claims, 9 Drawing Sheets

Phase encode gradient direction.

Read gradient direction.

Phase encode gradient direction.

Read gradient direction.

GHOST ARTIFACT REDUCTION

This is a continuation of PCT application PCT/GB98/03651, filed Dec. 8, 1998, the entire content of which is hereby incorporated by reference in this application.

FIELD OF THE INVENTION

The present invention relates generally to a method of and apparat us for reducing ghost artifact in image data. The invention has particular application in those Magnetic Resonance Imaging (MRI) techniques which are prone to coherent ghost artifact.

BACKGROUND OF THE INVENTION

In conventional Two Dimensional Fourier Transform (2DFT) MRI techniques, one "line"of data in sample space (also known as k-space) is acquired for each application of a radio frequency (rf) pulse. The resulting echo signals are sampled at various points during the evolution of the magnetic gradients in the "read direction"to obtain each line. Incremental increases in the magnetic gradient are applied in the "phase encode direction" in order to read successive lines through the sample. A two dimensional Fourier transformation is applied to the sampled data to obtain the image data.

Under certain circumstances there may be a periodic variation in the sampled data, leading to the appearance of a ghost artifact in the image data. The periodic variation may be in any of the parameters of the sampled data, for example the amplitude or the time of sampling. Any phenomenon that causes a periodic variation in the sampled data may give rise to a ghost artifact. Typical examples are periodic movements in the sample, such as may occur when imaging the heart or lungs, or periodic variations in the operating conditions of the imaging apparatus, which may be due to internal or external influences. In the case of the periodic movement of the heart, a coherent ghost artifact will appear if the heart rate is related to the sampling rate.

In certain MRI techniques, there may be a periodic variation in the sampled data due to the manner in which the data are acquired. Examples of such techniques are Echo Planar Imaging (EPI), Segmented EPI, and Echo Volumar Imaging (EVI).

Echo Planar Imaging differs from 2DFT in that an entire image is acquired from a single rf excitation pulse. To acquire the image, increments of magnetic gradient in the phase encode direction are applied, whilst switching the magnetic field in the read direction between positive and negative. The echo signals are sampled at various points during the evolution of the magnetic gradients to obtain sampled echo data. A two dimensional Fourier transformation is then applied to the sampled data to obtain the image data.

EPI intrinsically involves a periodic variation in the sampled data as a result of the alternate switching of the magnetic field in the read direction between positive and negative. This switching of the magnetic field results in alternate lines in the sampled data requiring time reversal prior to Fourier transformation. Any misalignment between the time reversed lines will result in a coherent ghost appearing in the image, overlapping with the real image.

Segmented EPI works by applying a number of excitation pulses, and acquiring part of the data, known as a segment, following each pulse. Changes in the operating conditions between the different segments, together with the switching of the magnetic field within each segment, may give rise to periodic variations in the sampled data with a periodicity of twice the number of segments. This will give rise to multiple ghost artifacts in the image domain.

For the purpose of simplicity much of the description henceforth will be directed towards EPI, which is highly prone to a single coherent ghost artifact at +Np/2 in resulting images, where Np is the number of points in the phase encode direction. However, the present invention is applicable to any imaging technique in which a coherent or pseudo-coherent ghost artifact occurs, regardless of the origin of the ghost artifact.

Various techniques have been used to reduce or cancel ghost artifact in EPI. Perhaps the simplest method is a manual technique, in which relative time shifts in the sampling points between time reversed lines are adjusted manually, until the ghost disappears. This has the disadvantage that it requires the intervention of a skilled operator. It also requires that the system has real time data acquisition, reconstruction and image display facilities.

An alternative technique for ghost elimination has been proposed, in which a calibrating scan is first done to determine the time shift between the time reversed lines of data. This time shift is then used to correct the errors in subsequent imaging scans. This has the disadvantage of being complex and of increasing the time required for imaging. Furthermore, there may be changes in the time shift between the calibrating scan and the imaging scan, leading to a reduction in the efficiency of the ghost cancelling.

Methods employing additional, redundant, reference scan lines within the imaging sequence have been proposed (Jesmanowicz et al SMRM abstract, 1993, p 1239 and EP 0644 437A, Philips Electronics NV, 1995). As these require extra data sampling these methods prolong the data acquisition and hence the imaging times, which is critical in high speed imaging techniques.

A post processing method of reducing ghost artifact has been proposed by Bruder et al in Magnetic Resonance in Medicine, vol. 23, pp 311–323, (1992). Bruder et al proposed automatic adjusting of the data in the image domain until the ghost substantially disappears. This technique relies on the genuine image and the ghost image being spatially separated, that is, not overlapping in the imaging field. The technique therefore cannot be used if there is a genuine image across the whole of the imaging field. In EPI this is a significant disadvantage, since the size of the imaging field is limited by the ability of the imaging apparatus to generate large and rapidly varying magnetic fields. Consequently, it is highly undesirable to reduce the area allocated to the genuine image even further, by dedicating an area for use in ghost artifact reduction.

A similar technique to that of Bruder et al has been proposed by Buonocore et al in Magnetic Resonance in Medicine, vol. 38, pp 89–100, (1997). The technique of Buonocore et al also relies on analysing the ghost image in isolation and therefore can only be used when there is an area of no overlap between the genuine image and the ghost image. This technique therefore suffers from the same disadvantages as that of Bruder et al.

If employed with imaging techniques such as Segmented EPI, where multiple ghost artifacts occur, the techniques of Bruder et al and Buonocore et al would require the collection of correspondingly more lines dedicated to ghost removal and devoid of genuine image rendering them even less practical.

SUMMARY OF THE INVENTION

It is an aim of the present invention to provide a method of and apparatus for reducing ghost artifact that overcomes or reduces the problems of the prior art.

In one aspect, the invention provides an apparatus for reducing ghost artifact in image data, the apparatus being for use with an imaging apparatus which produces sampled raw image data that may experience a periodic variation giving rise to said ghost artifact, the apparatus comprising image reconstruction means for converting the sampled raw image data into the image data to reconstruct an image, characterized by means for analysing the sampled raw image data alone to determine a correction to reduce the ghost artifact, without requiring additional sampled data beyond that required by said image reconstruction means.

Analysing the sampled data (rather than the image data) to determine the correction can afford the advantage that a correction to reduce ghost artifact may be calculated without requiring extra data to be acquired. At the same time, the present invention can be readily implemented with existing magnetic resonance imaging techniques as it does not necessitate any changes in data sampling procedures. The need for operator interaction in reducing ghost artifact may be avoided. Analysing the sampled data, rather than adjusting the operating conditions, gives the advantage that ghost artifact may be reduced regardless of the origin of the artifact.

It has been realised pursuant to the present invention that coherent ghost artifacts may result from an offset of actual sampling points from desired sampling points, that is, those required by the Fourier transform for correct, artifact free, image reconstruction. Therefore the analysing means may comprise means for determining an offset of an actual sampling point in the sampled data from a desired sampling point to thereby determine the correction.

The determining means may be adapted to determine the offset of an actual sampling point from the point of maximum signal in the sampled data, since this can afford an efficient and convenient way of determining the offset. The point of maximum signal is typically where all rf components are coherent. For simplicity, the determining means may be adapted to perform a fitting procedure on the sampled data to estimate the point of maximum signal.

The apparatus may further comprise means for separating the sampled data into two or more data sets and the analysing means may be adapted to determine a correction for at least one such data set; in this case the correction may be an offset of an actual sampling point from a desired sampling point in that data set. Each data set may contain data that were acquired at corresponding points in different cycles of the periodic variation.

For example, in EPI, there is a periodic variation in the sampled data due to the alternate switching of the magnetic field in the read direction between positive and negative. The sampled data may therefore be separated into two data sets, one containing the data acquired with the positive field, and the other containing the data acquired with the negative field. In Segmented EPI, the sampled data may be separated into a number of data sets equivalent to twice the number of segments, and each containing the data acquired with a positive or negative field in one segment. In general, the number of data sets will correspond to the number of images (genuine and ghosts).

The analysing means may be adapted to determine a correction for one data set relative to another. This can allow one data set to be corrected relative to another, rather than having to correct each data set individually; hence the amount of processing can be reduced.

It has been realised pursuant to the present invention that a correction may advantageously be applied to the data sets after transformation, as this can allow a simple phase correction to be applied to the transformed data. The apparatus may therefore further comprise means for separately transforming the data in each data set, and, if so, means may be provided for converting the correction to a correction to be applied to transformed data, and for applying the converted correction to transformed data.

The analysing means may be adapted to determine a correction for substantially all of the data in each data set and the correction applying means may be adapted to apply the converted correction to substantially all of the transformed data in one or more of the data sets. This can reduce the amount of processing, since the same correction is applied to all of the data in a data set.

In a first preferred embodiment, the transforming means may be adapted to perform a first one dimensional Fourier transformation, the correction applying means may be adapted to apply the converted correction to the transformed data in one or more of the data sets, and the apparatus may further comprise means for performing a second one dimensional Fourier transformation on the transformed data. The second one dimensional Fourier transformation may be orthogonal to the first.

In a second preferred embodiment, the transforming means may be adapted to perform a two dimensional Fourier transformation. In this case, the correction is applied to substantially all of the data in one or more of the data sets following a two dimensional Fourier transformation. A two dimensional Fourier transformation can be more efficient than two orthogonal one dimensional Fourier transformations.

In a third preferred embodiment, instead of applying a correction to all of the data in a data set, the analysing means may be adapted to determine a correction for a portion of the data in each data set and the correction applying means may be adapted to apply the converted correction to a portion of the transformed data in one or more of the data sets. Each data set may thus be divided into a plurality of portions and each portion may correspond to one line in each data set, or to a group of lines, or some other subset. In this case, a correction may be calculated individually for each portion and a converted correction applied to each of the corresponding portions. This may be advantageous when the correction that needs to be made varies within the data set. This situation may arise due to imperfect gradients and field inhomogeneities.

The transforming means may be adapted to perform a first one dimensional Fourier transformation, the correction applying means may be adapted to apply the converted correction to a portion of the transformed data in one or more of the data sets, and the transforming means may be further adapted to perform a second one dimensional Fourier transformation on the transformed data. The second one dimensional Fourier transformation may be orthogonal to the first.

The analysing means may be adapted to determine a correction for one portion of the data in a data set from the correction for another portion of the data in a data set. This can allow corrections to be determined for portions having data values with low Signal to Noise Ratios (SNR) which would otherwise give poor estimates of the corrections.

In any of the first three preferred embodiments, the apparatus may comprise means for transforming the sampled data, means for converting the correction to a correction to be applied to the transformed data, and means for applying the converted correction to the transformed data.

In a fourth preferred embodiment, the apparatus may further comprise means for applying the correction to the sampled data before conversion to image data. This may be preferred, for example where some other processing is to be carried out on the data prior to transformation.

In another aspect, the invention provides an imaging apparatus which is adapted to sample data, comprising the apparatus as aforesaid. The imaging apparatus may suitably include means for exciting nuclear magnetic resonance and means for detecting the resonance response signals. Further, the imaging apparatus may be adapted to sample data in lines, some of which are time reversed with respect to others. The imaging apparatus may for example be adapted to perform Echo Planar Imaging or Segmented Echo Planar Imaging. Alternatively, the imaging apparatus may be adapted for imaging three or more magnetic resonance dimensions such as in Echo Volumar Imaging or in the simultaneous acquisition of two spatial imaging dimensions and one chemical shift dimension.

In another closely related aspect, there is provided a method of reducing ghost artifact in image data, the method being for use with an image reconstruction technique in which sampled raw image data are produced and converted into the image data, the method characterised by analysing the sampled raw image data alone to determine a correction to reduce the ghost artifact without requiring additional sampled data beyond that required for image reconstruction.

The step of analysing the sampled data may comprise determining an offset of an actual sampling point in the sampled data from a desired sampling point to thereby determine the correction. The step of determining the offset may comprise determining the offset of an actual sampling point from the point of maximum signal in the sampled data. The step of determining the offset may comprise performing a fitting procedure on the sampled data to estimate the point of maximum signal.

The method may further comprise separating the sampled data into two or more data sets and determining a correction for at least one such data set. The step of analysing may comprise determining a correction for one data set relative to another.

The method may further comprise separately transforming the data in each data set. The method may further comprise converting the correction to a correction to be applied to transformed data, and applying the converted correction to transformed data.

The step of analysing may comprise determining a correction for substantially all of the data in each data set and the step of applying the converted correction may comprise applying the converted correction to substantially all of the transformed data in one or more of the data sets.

The step of transforming may comprise performing a first one dimensional Fourier transformation, the step of applying the converted correction may comprise applying the converted correction to the transformed data in one or more of the data sets, and the method may further comprise performing a second one dimensional Fourier transformation, which may be an orthogonal one dimensional Fourier transformation, on the transformed data.

Alternatively, the step of transforming may comprise performing a two dimensional Fourier transformation.

The step of analysing may comprise determining a correction for a portion of the data in each data set and the step of applying the converted correction may comprise applying the converted correction to a portion of the transformed data in one or more of the data sets.

The step of transforming may comprise performing a first one dimensional Fourier transformation, the step of applying the converted correction may comprise applying the converted correction to a portion of the transformed data in one or more of the data sets, and the step of transforming may comprise performing a second one dimensional Fourier transformation, which may be an orthogonal one dimensional Fourier transformation, on the transformed data.

The step of analysing may comprise determining a correction for one portion of the data in a data set from the correction for another portion of the data in a data set.

The method may comprise transforming the data, converting a correction to a correction to be applied to the transformed data, and applying the converted correction to the transformed data.

The method may further comprise applying the correction to the sampled data before conversion to image data.

In a further aspect, the invention provides an imaging method in which data is sampled, comprising the method as aforesaid. The imaging method may sample data in lines, some of which are time reversed with respect to others. For example, the imaging technique may be Echo Planar Imaging or Segmented Echo Planar Imaging. Alternatively, the imaging technique may be for imaging three or more magnetic resonance dimensions such as in Echo Volumar Imaging or in the simultaneous acquisition of two spatial imaging dimensions and one chemical shift dimension.

In yet a further related aspect, the invention provides a computer disc containing software for carrying out the method described above.

Preferred features of the present invention will now be described, purely by way of example, with reference to the accompanying drawings, in which:

BRIEF DESCRIPTION OF THE DRAWINGS

FIG. 10 shows the order in which data is collected when using segmented k-space techniques with interleaved lines;

FIG. 11 shows the order in which data is collected when using segmented k-space techniques with contiguous lines.

DETAILED DESCRIPTION OF THE INVENTION

Figure 1:
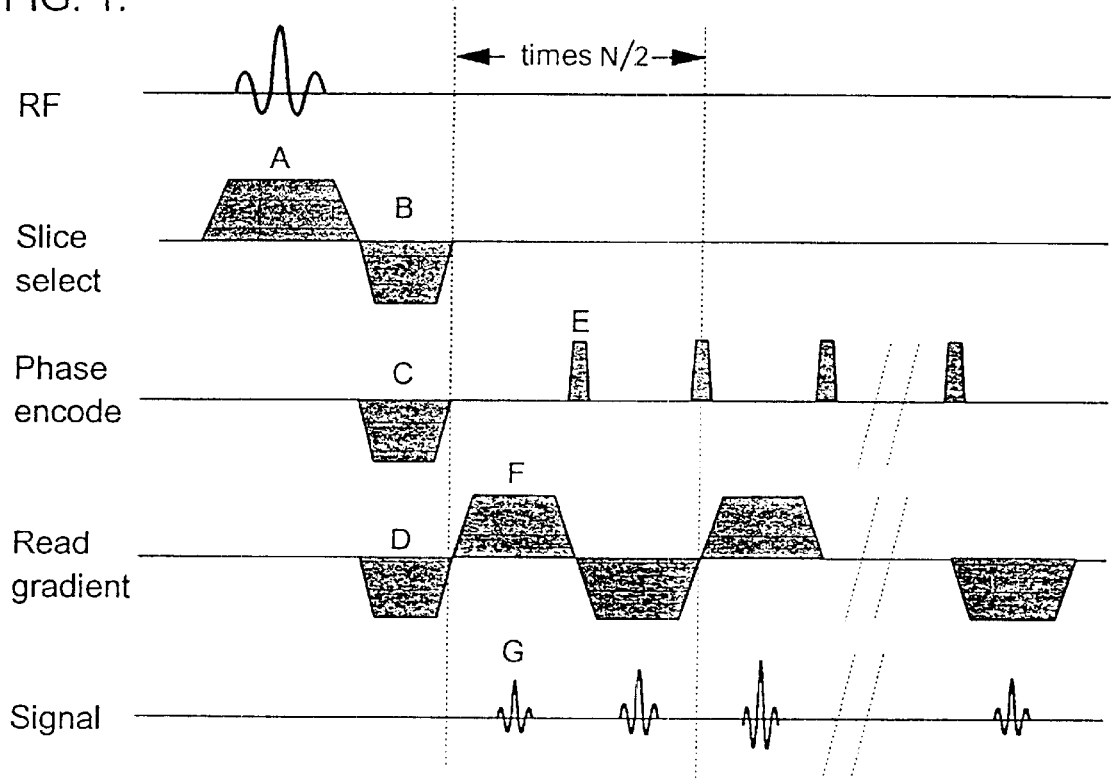
FIG. 1 is a diagrammatic representation of a standard blipped gradient EPI sequence.

FIG. 1 shows a standard two dimensional 'blipped' gradient EPI sequence that may be used for acquiring image data. An initial rf pulse in the presence of a slice selective gradient (A) rotates spins in the selected slice into the imaging plane. These are then refocused in the slice select direction by gradient waveform B. The gradient waveforms C and D dephase the spins in the phase encode and the read directions respectively. Subsequently, phase encode blips (E) and read gradient waveforms (F) rephase the spins in the respective directions then dephase them to a similar extent, giving rise to a signal that consists of a series of gradient echoes (G), and covering the entire sampling domain (commonly known as k-space) of the required image.

Figure 2:
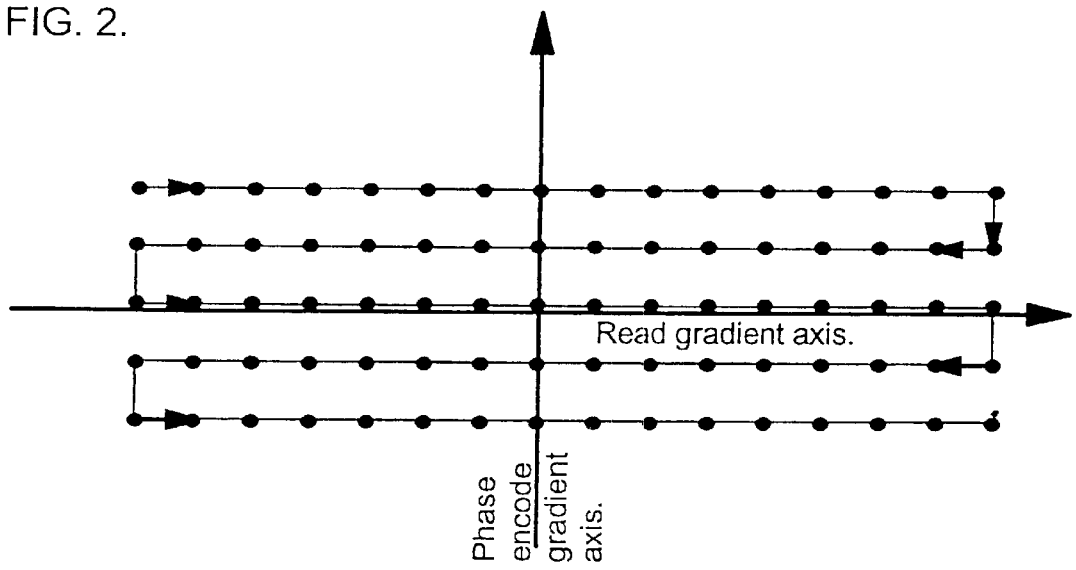
FIG. 2 illustrates the characteristic, alternate sweeping back and forth, sampling of k-space trajectory of the standard blipped EPI sequence.

By employing phase encoding increments during rapid switching of the read encoding, the sampling sweeps back and forth across k-space, as shown in FIG. 2. Consequently, the signal evolution proceeds in an opposite sense in time in alternate k-space lines, resulting in alternate lines in the sampled data being time reversed. These forward and time reversed lines will be referred to herein as odd and even lines. In EPI, a periodic variation in the sampled data therefore occurs due to the nature of the data acquisition.

Prior to Fourier transformation, all of the odd lines, or all of the even lines, must be time reversed. Fourier transformation of the resultant data produces the required Magnetic Resonance (MR) image. Successful image reconstruction relies upon satisfying the Fourier sampling conditions. For N×M image points there must be N×M linearly independent measurements (samples). The sample points must include the centre of k-space, the centre of k-space being that point at which all signals, at all frequencies, are coherent (in phase). The Fourier transformation is an extremely efficient way of solving the N×M simultaneous equations associated with the N×M samples. The resulting image is real rather than complex.

Imperfections in the MR procedure will be reflected in imperfections in the image. Such imperfections include minute sample timing errors resulting in displacement of the sample points from the origin, variations in gradient strengths during the acquisition of data points, and magnetic field inhomogeneity. In conventional imaging, N×M complex data points are acquired, which is equivalent to 2×N×M linearly independent samples. Subsequent Fourier transformation produces a complex image in which the above imperfections result in phase differences between points in the image. Consequently, these errors are corrected by taking the modulus at each point, that is the two fold redundancy is used to correct the experimental errors. If the errors are substantially spatially global, two fold redundancy is not necessary and various partial k-space reconstruction techniques can be employed that significantly reduce the amount of data required. All these conventional reconstruction techniques rely upon the errors being globally consistent.

With EPI the time reversal of the alternate lines introduces further errors that simply taking extra data points and determining the modulus image does not correct. If the data is ideal, that is if all the Fourier sampling conditions are met, time reversal introduces no ghost artifact. In practice, this is rarely possible as it requires perfect alignment of the samples with the centre of k-space, perfect gradients and perfect homogeneity. A timing error of one sample point (typically of 10 microseconds for EPI) produces a linear phase error of 360° across the width of the resulting image. A temporal displacement of the sample points from the centre of k-space will result in a periodic displacement of the phase encode axis when alternate lines are time reversed. This situation is illustrated in FIG. 3.

Figure 3:
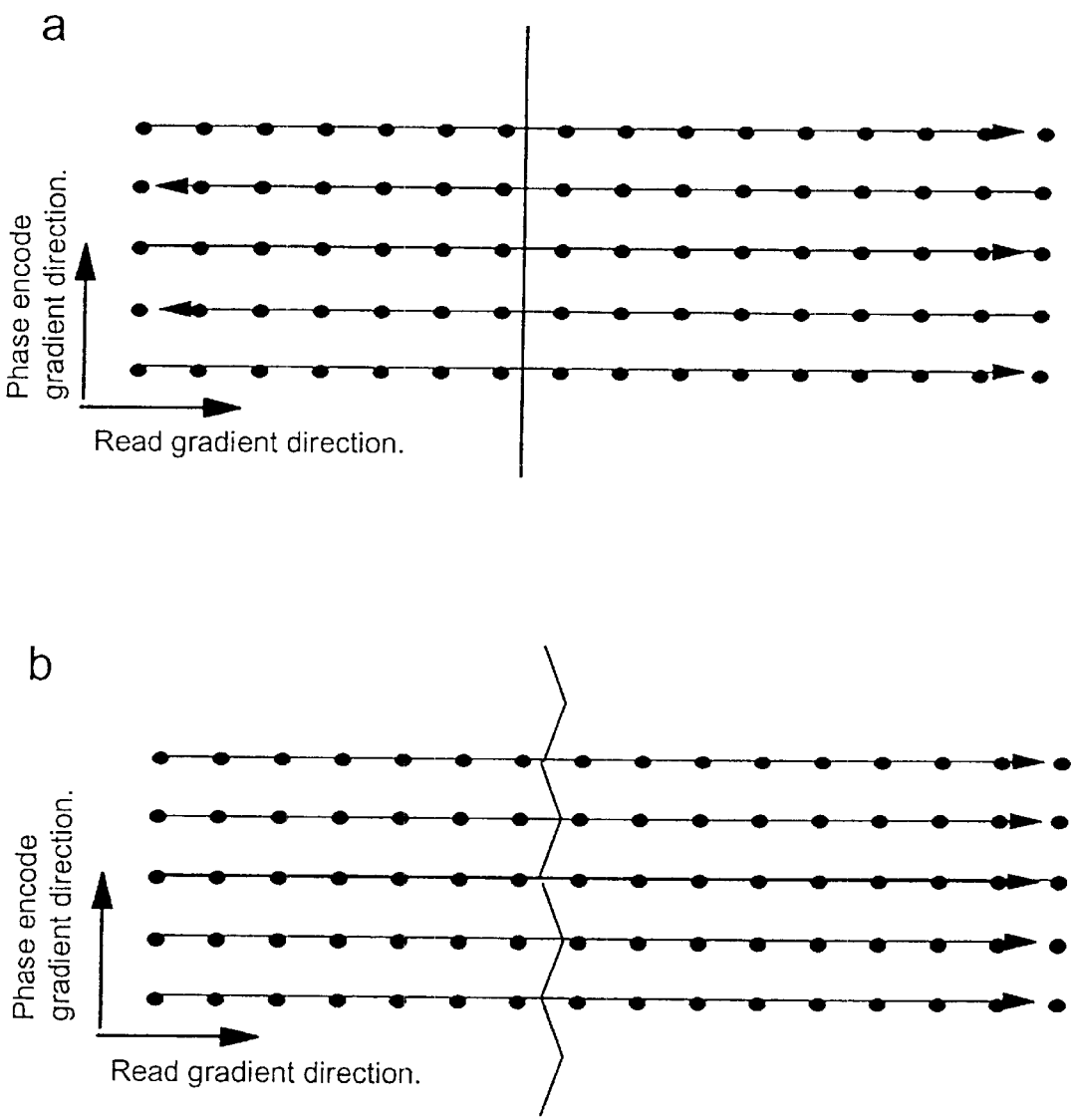
FIGS. 3 (a and b) show EPI sample points displaced relative to the true phase encode axis which passes through the centre of k-space where all spins align.

FIGS. 3 show the EPI sample points displaced relative to the true centre of k-space where all spins align, that is, all spins are in phase. The solid vertical line is the phase encode axis along which all spins are affected only by the encode gradient. FIG. 3a shows the sample points as collected. FIG. 3b shows the same sample points following time reversal of the alternate, odd, lines and the resulting staggering of the phase encode axis relative to the sampling points. The sample points are used as the reference since it is these that are measured, and which subsequently the Fourier transformation uses as its reference for reconstruction, as the location of the true centre of k-space is unknown.

Figure 4:
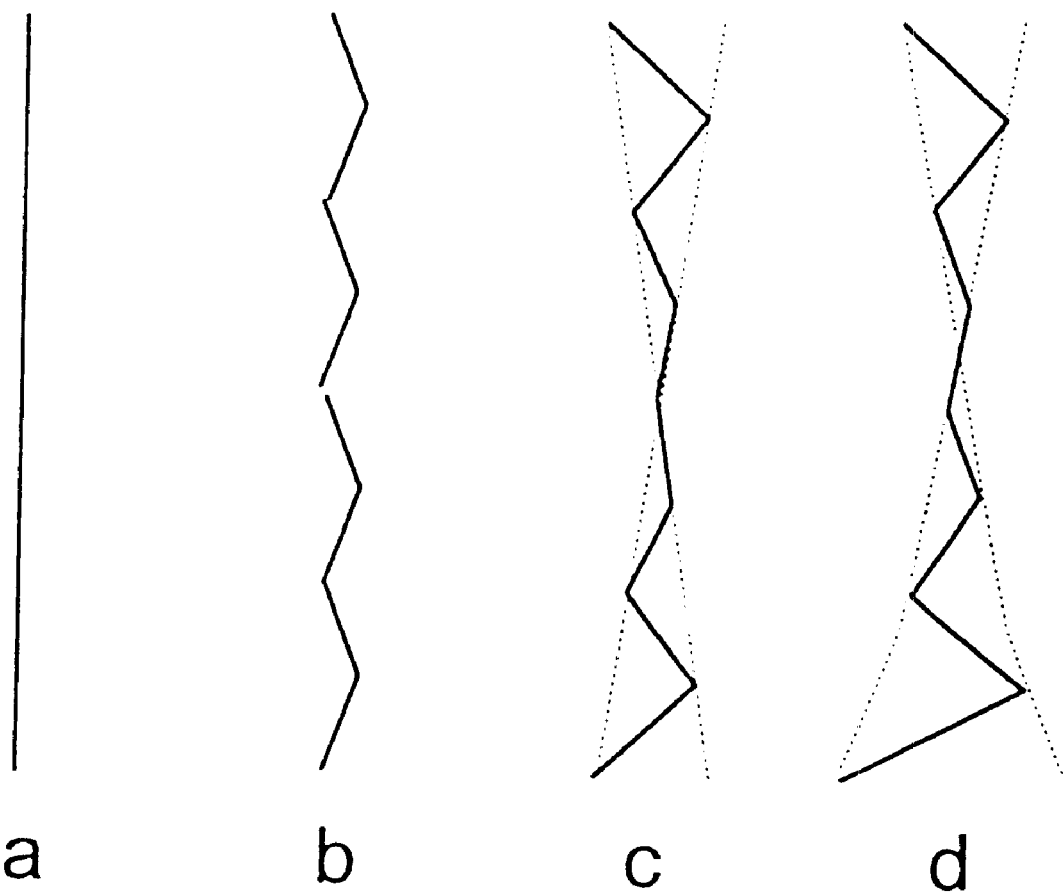
FIG. 4 show the effects of various magnetic field perturbations upon the position of the phase encode axis relative to the sample points following time reversal of alternate, odd, lines.

Imperfect gradients and field inhomogeneities may produce additional displacements of the phase encode axis relative to the sample points. FIG. 4 show the effects of various other magnetic field perturbations upon the position of the phase encode axis relative to the sample points following time reversal of alternate, odd, lines. FIG. 4a shows the ideal situation where the sample points align perfectly with the phase encode axis; this requires no correction. FIG. 4b shows the effect of a displacement of the sample points relative to the phase encode axis, similar to FIG. 3b. FIG. 4c shows the effect of a displacement of the sample points relative to the phase encode axis when there is a linear field inhomogeneity or consistent difference between the areas under the positive and negative lobes of the phase encode gradients. FIG. 4d shows the effect of a displacement of the sample points relative to the phase encode axis when there is a non-linear field inhomogeneity or variable differences between the areas under the positive and negative lobes of the phase encode gradients, for example when there is some droop in the power supply. These periodic differences between the even and odd lines result in a coherent ghost image positioned, and aliased, exactly one half the imaging length in the phase encode direction, as further explained below.

Figure 5:
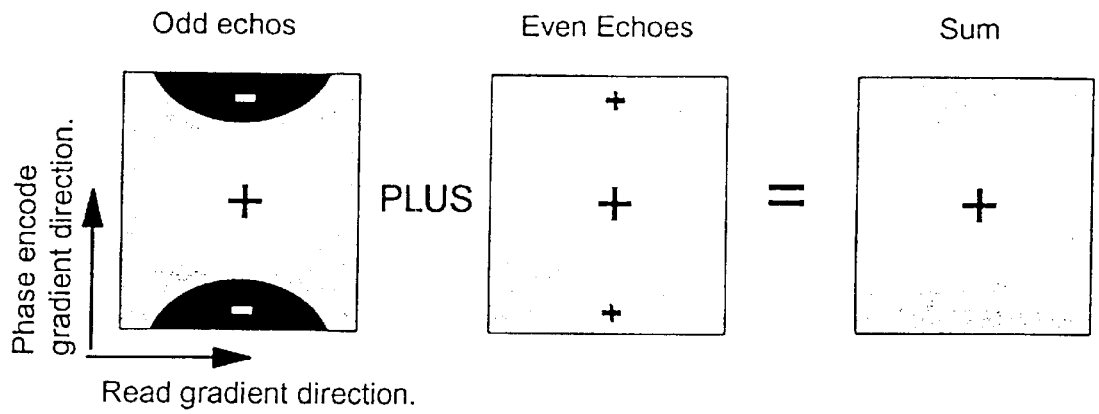
FIG. 5 illustrates the images that result from separately reconstructing even and odd echoes.

FIG. 5 illustrates the images that result from separately transforming the even lines and the odd lines into the image domain in the ideal case where the sample points are perfectly aligned with the phase encode axis. The even lines, in this case, give rise to a positive image and a positive ghost. The odd lines, by contrast, give rise to a positive image and a negative ghost having a phase shift of 180° relative to the positive image. Adding these constructively reinforces the true image while cancelling the ghost. It should be noted that for clarity the image and ghost have been shown spatially separated, whereas in practice this would be undesirable due to the additional gradient strength or sampling time that this would require.

Figure 6:
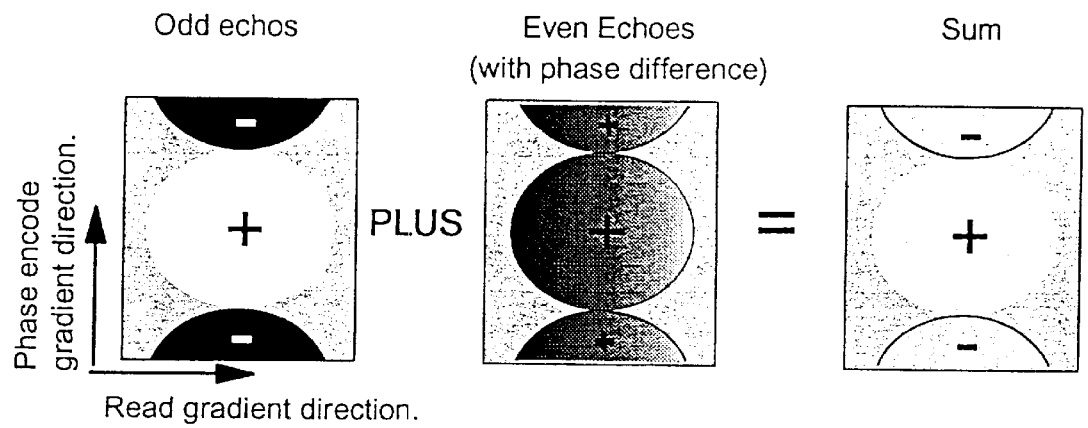
FIG. 6 illustrates the images that result from separately reconstructing the even and odd echoes when there is a temporal displacement of the even echoes.

FIG. 6 illustrates the images that result from separately transforming the even lines and odd lines when there is a temporal displacement of the even lines, giving rise to a linear phase variation across the entire imaging field (comprised of both true and ghost components). Adding these results in incomplete constructive reinforcement of the true image and in incomplete cancelling of the ghost. Therefore, any relative temporal displacement between the even and odd lines will give rise to a ghost image. Again, for clarity the image and ghost have been shown spatially separated.

Figure 7:
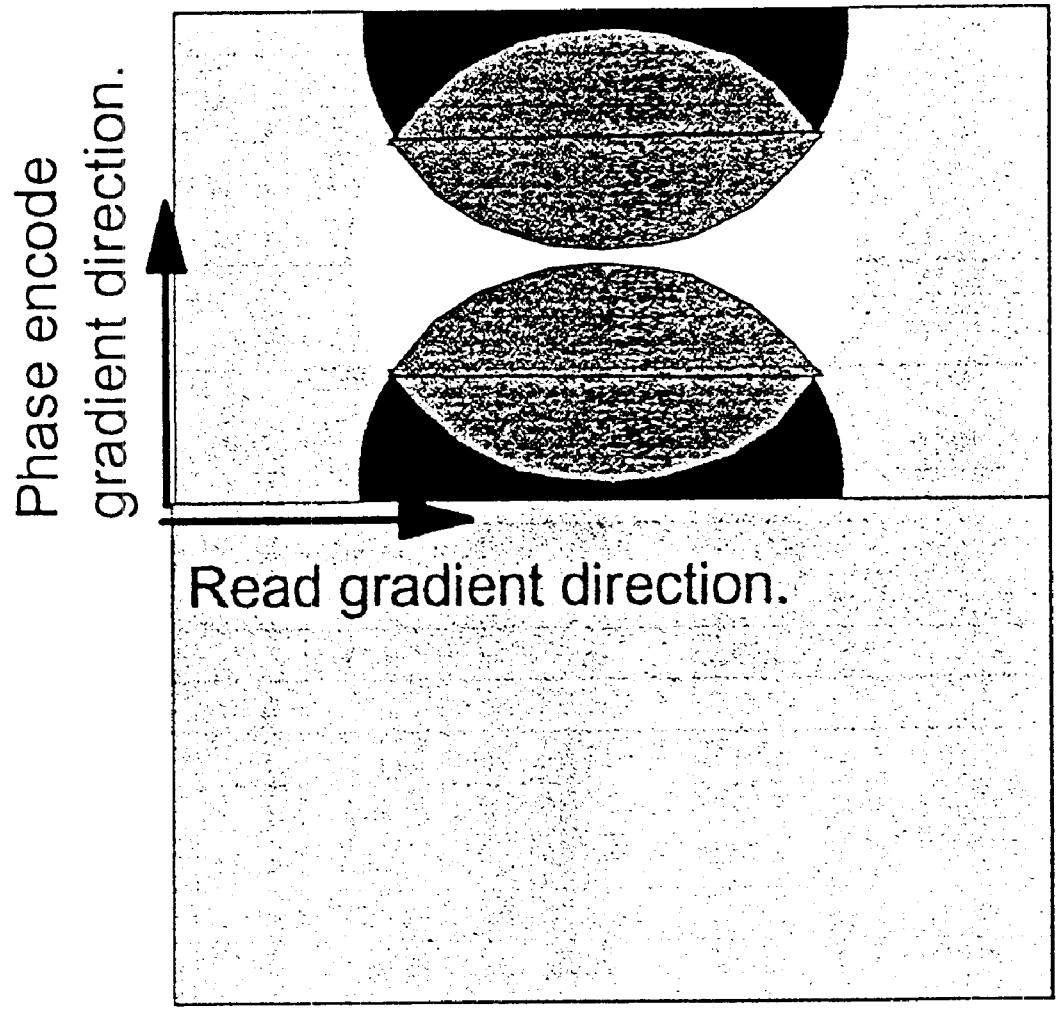
FIG. 7 shows the situation where the image extends for almost all of the imaging field in the phase encode direction.

FIG. 7 shows the usual situation wherein the image extends for almost all of the imaging field in the phase encode direction. This is preferred due to the limited number of lines that can be sampled in the phase encode direction within the confines of the available magnetic field strength and the allowed sampling time.

In a first preferred embodiment, the sampled data are analyzed prior to transformation to determine a global correction that needs to be made to the intermediate data that result from a one dimensional Fourier transformation in the read direction. The sampled data are split into two data sets consisting of the even and the odd lines respectively and the missing lines in both are replaced by zeros. The lines in one data set are then reversed in the read direction. The data in the odd and even data sets are then analyzed to determine a correction that needs to be made. This is done by estimating the temporal shifts of the even data ($t_e$) and the odd data ($t_o$) from the phase encode axis. From these estimates, a phase correction to be applied to the intermediate data may be determined.

Fourier transformation theory teaches that there is a linear relationship between a temporal shift in the data in one domain and a first order phase shift in the other, a shift by one data point in one domain being equivalent to a $2\pi$ (360°) phase shift in the other domain. The relative phase correction $\Phi$ to be applied to one of the data sets of the intermediate data may therefore be determined from the values of $t_e$ and $t_o$ according to the following formula:

$$\phi = 2\pi \frac{t_e - t_o}{T} \qquad 1$$

where T is the time between successive sample points.

The two sets are Fourier transformed in the read direction and the linear phase correction is applied across the width of the one of the data sets. The two data sets are then added together and the resulting single data set is Fourier transformed in the phase encode direction to produce the final image.

Since the centre of k-space is the point where all the spins are in phase, it will correspond to the position of maximum signal. Consequently, the values of $t_e$ and $t_o$ may be determined by calculating the temporal offset between the position of the maximum signal and the datum of highest value in the relevant data set. Taking the datum of highest value, rather than the datum that is closest to the position of the maximum signal, ensures that no phase aliasing occurs when the offset is more than half the time between sampling points.

One technique for determining the position of the maximum signal consists of locating the two data points of maximum signal in the original even ($s_e'(i_e, j_e)$) and odd ($s_o'(i_o, j_o)$) data sets, where i and j are the integer positions in the read and phase encode directions respectively, and estimating the position of the maximum signal between these two points. This can be done by finding the maximum position t of the second order polynomial fit to the magnitude of the three data points $s_e(i_e-1)$, $s_e(i_e)$ and $s_e(i_e+1)$ where $s_e(i_e)$ is the point of maximum signal and all points are along the same read line $j_e$, and similarly for the odd data ($s_o$), according to the following formula:

$$t = \frac{|s(i-1)| - |s(i+1)|}{2(|s(i-1)| + |s(i+1)| - 2|s(i)|)} \qquad 2$$

where s=either $s_e$ or $s_o$. The first order phase offset $\theta$ is then given by:

$$\theta = 2\pi\left(i - \frac{N_r}{2} + t\right) \qquad 3$$

where $N_r$ is the number of sample points in the read direction. The difference between the phase offsets of the odd and even data sets is then determined to produce a single relative first order phase correction.

This process is equivalent to "least squares fitting" a linear phase in the read direction to the respective phase image, but has the advantage of being completely immune to aliasing of the phase.

Figures 8A, 8B:
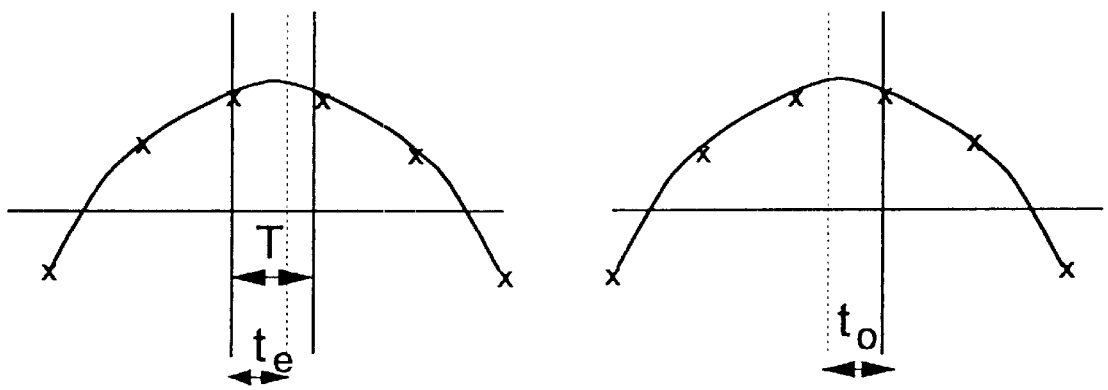
FIG. 8 shows the intensity of the maximum signal in each read line of the sample data relative to the sample points.
Figure 9A:
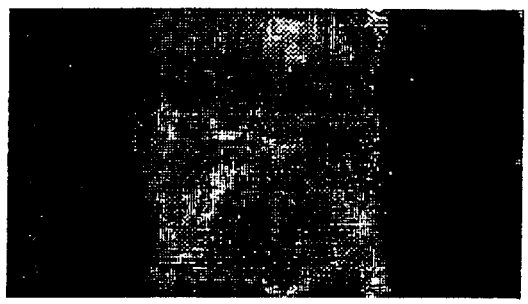
FIGS. 9a–9d show reconstructions of a 64×128 EPI image of a section through a pepper.
Figure 9B:
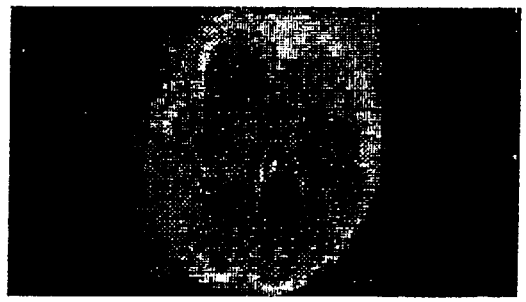
Figure 9C:
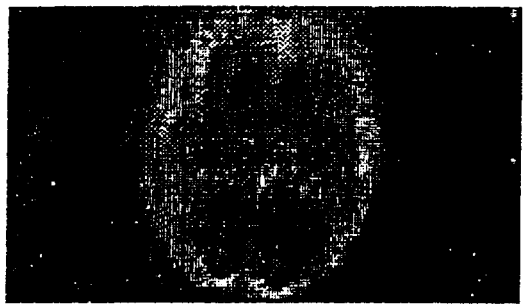
Figure 9D:
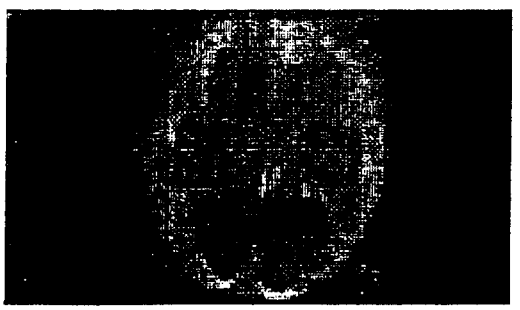

FIG. 8 shows the intensity of the maximum signal in each read line of the sample data relative to the sample points for the even echoes (FIG. 8a) and the odd echoes (FIG. 8b).

Since the odd data and even data sets contain data from adjacent lines in k-space, their maxima are not coincident. The zero filling of alternate lines in the data sets means that a line having values in one data set will be zero filled in the other. It is possible to use the displacements in adjacent lines to estimate the relative displacements of the sample points from the true centre of k-space. However, a better estimate can be obtained by averaging the displacements in lines on either side of a line that has been zero filled in one of the data sets, and combining the average displacement with the displacement in the corresponding line in the other data set. In practice the difference between the displacements of two adjacent non-zero lines in either even or odd data sets will be small.

In a second preferred embodiment, phase corrections are determined in the same way as in the first embodiment. However, the resulting global phase correction is applied to one data set following a complete two dimensional Fourier transformation into the image domain. In this embodiment, the even and odd data sets are transformed separately into the image domain, and the first order phase correction is applied directly to one of the resultant images. This is possible as long as any phase variation in the phase encode direction is negligible. This embodiment would be suitable for eliminating the ghost artifacts illustrated in FIGS. 6 and 7.

In the second embodiment, no processing need be done on the intermediate data, and so a two dimensional fast Fourier transformation can be used to transform the two data sets directly into the image domain. A single two dimensional fast Fourier transformation is much more computationally efficient than the separate application of two orthogonal one dimensional Fourier transformations.

In the first and second embodiments only one line in each data set is used to determine a global phase correction. The lines used will typically be those closest to the centre of k-space as these will have the largest values, and consequently the highest SNR, and hence will give the best estimates of the required first order phase correction. The methods of the first and second embodiments assume that all lines of a data set have the same shift in the phase encode axis. In reality this may not be the case, as was discussed with reference to FIGS. 4c and 4d.

In a third preferred embodiment, the first order phase correction can be applied individually to each line of the data in the read direction, to allow for different shifts of the sample points in each line in the phase encode axis. One way of achieving this is by applying the algorithm described above with reference to equations (2) and (3) to each line of the k-space data sets. The resulting set of linear phase corrections is then applied to the odd or even data following Fourier transformation of the k-space data in the read direction only. This is possible because after the first Fourier transformation there is still a one-to-one correspondence between the lines in k-space and the lines of the intermediate data in the read direction. The corrected data sets are then added together point by point and the combined data set is Fourier transformed in the phase encode direction to produce the final image. Again, it is a simple matter to incorporate this automated phase correction into standard image reconstruction.

Typically in MRI data the maximum values in each line of the data decrease rapidly with distance from the read axis, and therefore the signal to noise ratio (SNR) in the peripheral lines may be too low to give good estimates of the required corrections. To obviate this, in the third preferred embodiment, the lines that are used to determine the corrections may be limited to lines within a given distance of the centre of k-space and the corrections extrapolated onto the remaining lines by, for example, second and higher order phase filtering. In this technique, the central lines of the k-space data are extracted and zero filled to the full extent of the original data. The even and odd lines are then separated as usual and then Fourier transformed separately. The resulting complete phase data for each is then used to phase correct the complete even and odd data, in the manner described above, either after one, two or more Fourier transformations as appropriate. The data for phase correction can be further restricted to a central region of k-space, limiting both the number of lines and the number of data points in those lines.

Alternatively, thresholding criteria could be applied; for example, only those lines whose maxima are above a certain threshold could be employed to determine relative first order phase corrections. The remainder could then be extrapolated by, for example, zero filling as outlined above. Similarly, thresholding could be applied to individual data points and only those data points that are above the threshold could be used.

In a fourth preferred embodiment, the problem of ghosting is solved by analysing the data that is acquired in the sampling domain and correcting the data in the sampling domain before transformation of the k-space data to the image domain. The same techniques as described above with reference to equation (2) is used to determine the temporal offsets of the odd and even data sets from the true centre of k-space. The difference between the two offsets gives a relative offset. Rather than determining a phase shift to be applied to the fully or partially transformed data, the sampled data values in one data set are extrapolated or interpolated to determine the data values that would have occurred had the sampling points been coincident with the sampling points of the other data set. This technique might be preferred, for instance where some other processing is to be done on the data prior to transformation.

FIG. 9 shows reconstructions of a 64×128 EPI image of a section through a pepper. FIG. 9a is the image without any correction to alternate echoes, clearly showing the presence of a severe ghost. FIG. 9b shows the effect of manually setting a global first order phase correction (in this case of −500°) in the read direction. The process involved changing the first order phase by an arbitrary amount and observing the effect and modifying the first order phase correction accordingly. The result shown took six iterations by an experienced operator and considerable time. FIG. 9c shows the effect of applying the global first order phase (−473°) correction given by differences in the even and odd phases, each of which was determined by equation 2. FIG. 9d shows the effect of applying individual first order phase corrections to each read line of one image.

The present techniques are also capable of reducing ghost artifact in segmented EPI. Segmented EPI, also known as Hybrid EPI/2DFT, was developed in an attempt to overcome the limited scan range of EPI. In EPI, the planar volume that can be sampled from a single pulse is limited by a number of factors. The sampling must be done before the spins relax from the rf excitation pulse. This typically imposes a time limitation of the order of 100 ms for the sampling. For each line that is to be read, the magnetic fields in the read direction must be switched between very large values with a high degree of accuracy. The ability of the coil assemblies to generate these fields limits the speed and range of the switching. Ultimately, switching rates are limited by safeguards upon the tolerance of the subjects. Therefore only a limited number of lines can be sampled in the phase encode direction within the limitations of the available magnetic field strength and the allowed sampling time.

Segmented EPI works by applying a plurality of rf excitation pulses and acquiring a part of the data with each rf excitation, each part constituting one segment. The acquired data therefore consists of a plurality of segments, each consisting of two data sets (one set of even lines and one set of odd lines).

Figures 10, 11:
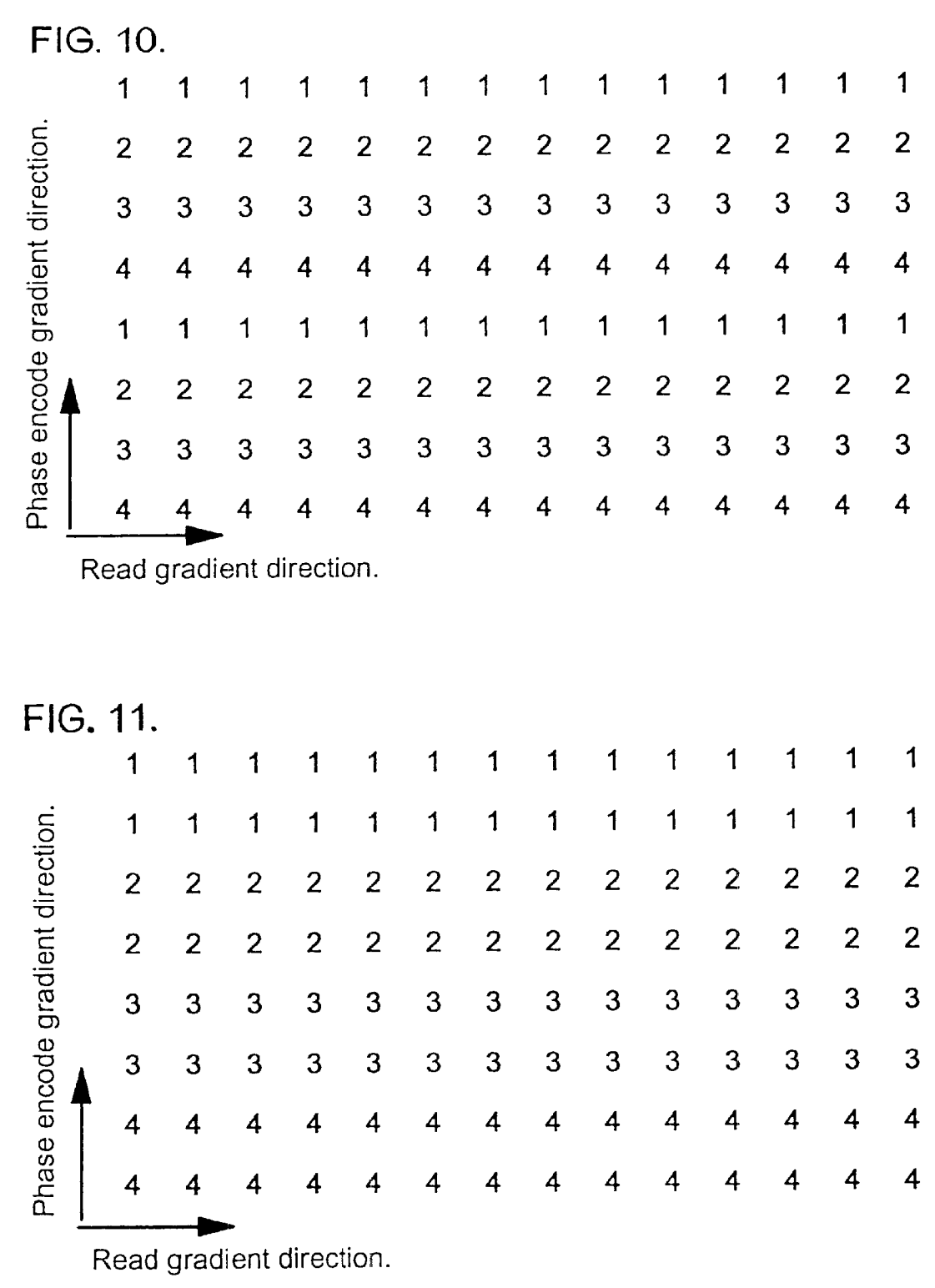

FIG. 10 shows the order in which data is collected when data is sampled in interleaved lines. Shown are eight lines, where the first and fifth lines (data points labelled 1) are collected after the first rf excitation, the second and sixth lines (data points labelled 2) are collected after the second rf excitation, and so on. FIG. 11 shows the order of data collection when data is sampled in contiguous lines. Shown are eight lines, where the first and second lines (data points labelled 1) are collected after the first rf excitation, the third and fourth lines (data points labelled 2) are collected after the second rf excitation, and so on.

In segmented EPI, multiple ghosts occur due to relative time shifts between the lines of each segment, as well as between odd and even lines. The number of ghosts will correspond to the number of segments. For example, segmentation into four groups in the way illustrated in FIG. 10 would, in the presence of environmental change between each group, give rise to seven ghosts in addition to the genuine image.

In order to reduce the multiple images that occur in segmented EPI, the sampled data is first split into odd and even data sets for each segment. This gives a number of data sets corresponding to twice the number of segments. The temporal offset of each data set to the true centre of k-space is then determined in the same way as described above with reference to equation (2). Any of the correction techniques described in the first to fourth embodiments above may then be applied.

For example, a global phase correction may be determined for each data set relative to an arbitrary reference data set using equation (3) above. Each data set is then Fourier transformed in the read direction, and the phase corrections applied to the resulting intermediate data sets. The corrected data sets are then added by supposition (adding the value at each even spatial point to the value at the corresponding odd spatial point) and the resultant data set transformed in the phase encode direction to obtain the image. This technique corresponds to the first embodiment described above. The global phase correction may also be applied to data sets that have been transformed directly into the image domain, as described with reference to the second embodiment above.

Alternatively, the phase of each line may be determined separately as described above with reference to the third embodiment. Each data set is then Fourier transformed in the read direction and the phase corrected in each line of the intermediate data. The corrected data sets are then added by supposition and the resultant data set Fourier transformed in the phase encode direction to obtain the image. The techniques of extrapolation for lines far from the centre that were described with reference to the third embodiment could also be used in segmented EPI.

Corrections may also be made to the sampled data prior to transformation in the same way as described with reference to the fourth embodiment.

Any of the techniques described above may also be used in three and higher numbers of MR dimensions. Three dimensional magnetic resonance imaging techniques include Echo Volumar Imaging (EVI), as described in Mansfield et al, Journal of Computer Assisted Tomography vol. 19 pp 847–852 (1995), and the simultaneous acquisition of two spatial imaging dimensions and one chemical shift dimension, as described in Guilfoyle et al, Magnetic Resonance in Medicine vol. 10, pp 282–287 (1989).

The present techniques also have application in the removal or reduction of artifacts arising from localized effects within the imaging field, such as motion artifact. Motion artifact results from the movement of all, or part of, the subject between successive data sampling for a particular image. This movement results in the Fourier Transformation incorrectly assigning the signal energy in the phase encode direction. This results in a signal intensity loss in the correct region in the final image, with a corresponding reappearance displaced in the phase encode direction. The reappearance can take the form of a displacement, a coherent ghost or a random smearing, depending on the degree of coherence between the movement and the sampling rate.

If the movement is itself periodic, as in the case of a heart beating or any motion related to this, and the heart and sample rates have a rational ratio within the integer bandwidth in the phase encode direction, then coherent ghosting will occur. For example, if the heart rate is eighty beats per minute (a period of 0.75 seconds) and a conventional 2DFT technique is employed at a line sampling rate of 0.385 seconds, the heart is sampled in two cardiac phases on alternate lines. In a similar fashion to the use of EPI this will result in a ghost, though in this case only of the heart, the artifact appearing displaced one half the imaging field length in the phase encode direction. Any of the techniques described above may be used to reduce such motion artifact.

The present techniques may also be applied to imaging techniques which use sampling strategies other than the regular lattice strategies outlined above. These alternative strategies include spiral sampling, square spiral sampling and polar projection reconstruction. The latter is the standard method used in Computed Tomographic imaging. All of these techniques produce, to a greater or lesser extent, a coherent ghost.

Figure 12:
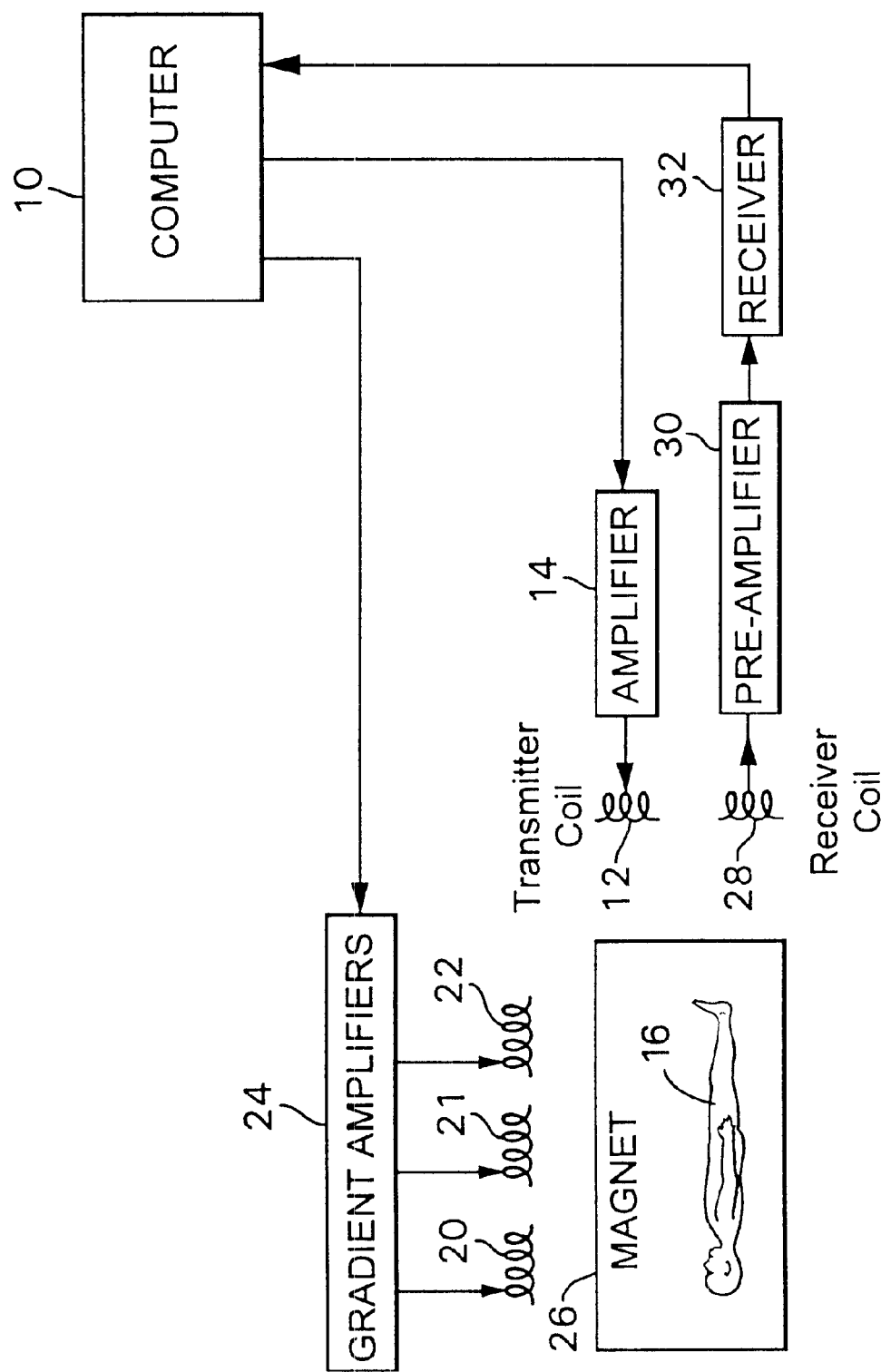
FIG. 12 shows an apparatus for use with a preferred embodiment of the invention.

FIG. 12 shows an apparatus that may be used for carrying out the present techniques. A computer 10 supplies pulses to a transmitter coil 12 via an amplifier 14. The transmitter coil 12 sends rf pulses to a sample 16. The computer also controls gradient coils 20, 21 and 22 via gradient amplifiers, designated generally 24. The gradient coils 20,21,22 supply magnetic gradients to the sample 16 under control of the computer 10. A magnet 26 supplies a constant magnetic field to the sample 16. Response signals from the sample 16 are detected by a receiver coil 28, which may be the same as coil 12, and fed to the computer 10 via preamplifier 30 and receiver 32. The computer 10 is programmed to process the received data and to carry out ghost artifact reduction in the way described above.

It will be appreciated from the foregoing that the present techniques thus provide useful and convenient techniques for removal of ghost artifacts in imaging techniques such as EPI, Segmented EPI and other imaging techniques where ghost artifact occurs.

The simplicity of the present technique in both not requiring the acquisition of additional data and in its use during post processing make it a highly desirable and applicable approach.

It will be understood that the present invention has been described above purely by way of example, and modifications of detail can be made within the scope of the invention.

Any reference numerals appearing in the claims are by way of illustration only and shall have no limiting effect on the scope of the claims.

What is claimed is:

1. Apparatus for reducing ghost artifact in image data, the apparatus being for use with an imaging apparatus which produces sampled raw image data that may experience a periodic variation giving rise to said ghost artifact, the apparatus comprising: image reconstruction means for converting the sampled raw image data into the image data to reconstruct an image, said sampled raw image data being free of redundant data, and means for analysing only said sampled raw image data to determine a correction to reduce the ghost artifact, without requiring additional sampled data beyond that required by said image reconstruction means.

2. Apparatus according to claim 1 wherein the analysing means comprises means for determining an offset of an actual sampling point in the sampled data from a desired sampling point in the raw image data alone to thereby determine the correction.

3. Apparatus according to claim 2 wherein the determining means is adapted to determine the offset of an actual sampling point from the point of maximum signal in the sampled data.

4. Apparatus according to claim 2 wherein the determining means is adapted to perform a fitting procedure on the sampled data to estimate the point of maximum signal.

5. Apparatus according to claim 1 further comprising means for separating the sampled data into two or more data sets, wherein the analysing means is adapted to determine a correction for at least one such data set.

6. Apparatus according to claim 5 wherein the analysing means is adapted to determine a correction for one data set relative to another.

7. Apparatus according to claim 5, farther comprising means for separately transforming the data in each data set.

8. Apparatus according to claim 7 farther comprising means for converting the correction to a correction to be applied to transformed data, and means for applying the converted correction to transformed data.

9. Apparatus according to claim 8 wherein the analysing means is adapted to determine a correction for substantially all of the data in each data set and the correction applying means is adapted to apply the converted correction to substantially all of the transformed data in one or more of the data sets.

10. Apparatus according claim 8 wherein the transforming means is adapted to perform a first one dimensional Fourier transformation and the correction applying means is adapted to apply the converted correction to the transformed data in one or more of the data sets, the apparatus further comprising means for performing a second one dimensional Fourier transformation on the transformed data.

11. Apparatus according to claim 8 wherein the transforming means is adapted to perform a two dimensional Fourier transformation.

12. Apparatus according to claim 8 wherein the analysing means is adapted to determine a correction for a portion of the data in each data set and the correction applying means is adapted to apply the converted correction to a portion of the transformed data in one or more of the data sets.

13. Apparatus according to claim 12 wherein the transforming means is adapted to perform a first one dimensional Fourier transformation, the correction applying means is adapted to apply the converted correction to a portion of the transformed data in one or more of the data sets, and the transforming means is further adapted to perform a second one dimensional Fourier transformation on the transformed data.

14. Apparatus according to claim 12 wherein the analysing means is adapted to determine a correction for one portion of the data in a data set from the correction for another portion of the data in a data set.

15. Apparatus according to claim 1 further comprising means for transforming the sampled data, means for converting the correction into a correction to be applied to transformed data, and means for applying the converted correction to the transformed data.

16. Apparatus according to claim 1 further comprising means for applying the correction to the sampled data before conversion to image data.

17. An imaging apparatus which is adapted to sample data, comprising the apparatus according to claim 1.

18. An imaging apparatus according to claim 17 wherein the apparatus is adapted to sample data in lines, some of which are time reversed with respect to others.

19. An imaging apparatus according to claim 18 wherein the apparatus is adapted to perform Echo Planar Imaging or Segmented Echo Planar Imaging.

20. An imaging apparatus according to claim 17 wherein the apparatus is adapted for imaging three or more magnetic resonance dimensions.

21. A method of reducing ghost artifact in image data, the method being for use with an image reconstruction technique in which sampled raw image data are produced and converted into the image data, said sampled raw image data being free of redundant data, the method characterised by analysing only said sampled raw image data to determine a correction to reduce the ghost artifact without requiring additional sampled data beyond that required for image reconstruction.

22. A method according to claim 21 wherein die step of analysing the sampled data comprises determining an offset of an actual sampling point in the sampled data from a desired sampling point to thereby determine the correction.

23. A method according to claim 22 wherein the step of determining the offset comprises determining the offset of an actual sampling point from the point of maximum signal in the sampled data.

24. A method according to claim 22 wherein the step of determining the offset comprises performing a fitting procedure on the sampled data to estimate the point of maximum signal.

25. A method according to claim 21 further comprising separating the sampled data into two or more data sets and determining a correction for at least one such data set.

26. A method according to claim 25 wherein the step of analysing comprises determining a correction for one data set relative to another.

27. A method according to claim 25 further comprising separately transforming the data in each data set.

28. A method according to claim 27 farther comprising converting the correction to a correction to be applied to transformed data, and applying the converted correction to transformed data.

29. A method according to claim 28 wherein the step of analysing comprises determining a correction for substantially all of the data in each data set and the step of applying the converted correction comprises applying the converted correction to substantially all of the transformed data in one or more of the data sets.

30. A method according to claim 28 wherein the step of transforming comprises performing a first one dimensional Fourier transformation and the step of applying the converted correction comprises applying the converted correction to the transformed data in one or more of the data sets, the method farther comprising performing a second one dimensional Fourier transformation on the transformed data.

31. A method according to claim 28 wherein the step of transforming comprises performing a two dimensional Fourier transformation.

32. A method according to claim 28 wherein the step of analysing comprises determining a correction for a portion of the data in each data set and the step of applying the converted correction comprises applying the converted correction to a portion of the transformed data in one or more of the data sets.

33. A method according to claim 32 wherein the step of transforming comprises performing a first one dimensional Fourier transformation, the step of applying the converted correction comprises applying the converted correction to a portion of the transformed data in one or more of the data sets, and the step of transforming comprises performing a second one dimensional Fourier transformation on the transformed data.

34. A method according claim 32 wherein the step of analysing comprises determining a correction for one portion of the data in a data set from the correction for another portion of the data in a data set.

35. A method according to claim 21 further comprising transforming the sampled data, converting a correction to a correction to be applied to the transformed data, and applying the converted correction to the transformed data.

36. A method according to claim 21 further comprising applying the correction to the sampled data before conversion to image data.

37. An imaging method in which data is sampled, comprising the method according to claim 21.

38. An imaging method according to claim 37 in which data is sampled in lines, some of which are time reversed with respect to others.

39. An imaging method according to claim 38 being for Echo Planar Imaging or Segmented Echo Planar Imaging.

40. An imaging method according to claim 37 being for imaging three or more magnetic resonance dimensions.

41. A program, when run on a computer, for carrying out the method of claim 21.

42. Apparatus for reducing ghost artifact in image data, the apparatus being for use with an imaging apparatus which produces sampled raw image data that may experience a periodic variation giving rise to said ghost artifact, the apparatus comprising:
   a computer programmed for converting the sampled raw image data into the image data to reconstruct an image, said sampled raw image data being free of redundant data, and for analysing only said sample raw image data to determine a correction to reduce the ghost artifact, without requiring additional sampled data beyond that required to reconstruct the image.

43. Apparatus according to claim 42 said computer being programmed for determining an offset of an actual sampling point in the sampled data from a desired sampling point in the raw image data alone to thereby determine the correction.

44. Apparatus according to claim 43 said computer being programmed to determine the offset of an actual sampling point from the point of maximum signal in the sampled data.

45. Apparatus according to claim 43 said computer being programmed to perform a fitting procedure on the sampled data to estimate the point of maximum signal.

46. Apparatus according to claim 42 said computer being programmed for separating the sampled data into two or more data sets, and to determine a correction for at least one such data set.

47. Apparatus according to claim 46 said computer being programmed to determine a correction for one data set relative to another.

48. Apparatus according to claim 46 said computer being programmed for separately transforming the data in each data set.

49. Apparatus according to claim 48 said computer also being programmed for converting the corrections to a correction to be applied to transformed data and for applying the converted correction to transformed data.

50. Apparatus according to claim 49 said computer being programmed to determine a correction for substantially all of the data in each data set and the correction and to apply the converted correction to substantially all of the transformed data in one or more of the data sets.

51. Apparatus according to claim 49 said computer being programmed to perform a first one dimensional Fourier transformation, to apply the converted correction to the transformed data in one ore more of the data sets, and for performing a second one dimensional Fourier transformation on the transformed data.

52. Apparatus according to claim 49 said computer being programmed to perform a two dimensional Fourier transformation.

53. Apparatus according to claim 49 said computer being programmed to determine a correction for a portion of the data in each data set and to apply the converted correction to a portion of the transformed data in one or more of the data sets.

54. Apparatus according to claim 53 said computer being programmed to perform a first one dimensional Fourier transformation, to apply the converted correction to a portion of the transformed data in one or more of the data sets, and to perform a second one dimensional Fourier transformation on the transformed data.

55. Apparatus according to claim 53 said computer being programmed to determine a correction for one portion of the data in a data set from the correction for another portion of the data in a data set.

56. Apparatus according to claim 42 said computer being programmed for transforming the sampled data, for converting the correction into a correction to be applied to transformed data, and for applying the converted correction to the transformed data.

57. Apparatus according to claim 42 said computer being programmed for applying the correction to the sampled data before conversion to image data.

58. An imaging apparatus which is adapted to sample data, comprising the apparatus according to claim 42.

59. An imaging apparatus according to claim 58 said computer being programmed to sample data in lines, some of which are time reversed with respect to others.

60. An imaging apparatus according to claim 59 said computer being programmed to perform Echo Planar Imaging or Segmented Echo Planar Imaging.

61. An imaging apparatus according to claim 58 said computer being programmed for imaging three or more magnetic resonance dimensions.

62. Apparatus for reducing ghost artifact in image data, the apparatus being for use with an imaging apparatus which produces sampled raw image data that may experience a periodic variation giving rise to said ghost artifact, the apparatus comprising:

image reconstruction means incorporating Fourier transformation for converting the sampled raw image data into the image data to reconstruct an image, the raw image data being free of redundant data; and means for analyzing only said sampled raw image data to determine a correction to reduce the ghost artifact, requiring only said raw image data necessary for Fourier reconstruction of the image.

63. Apparatus for reducing ghost artifact in image data, the apparatus being for use with an imaging apparatus which produces sampled raw image data that may experience a periodic variation giving rise to said ghost artifact, the apparatus comprising:

a computer programmed for conducting Fourier transformation to convert the sampled raw image data into the image data to reconstruct an image, the raw image data being free of redundant data and for analyzing only said sampled raw image data to determine a correction to reduce the ghost artifact, requiring only said raw image data necessary for Fourier reconstruction of the image.

* * * * *